United States Patent [19]

Grovender

[11] 4,340,266
[45] Jul. 20, 1982

[54] CONNECTOR SYSTEM

[75] Inventor: Steven L. Grovender, St. Paul, Minn.

[73] Assignee: Minnesota Mining and Manufacturing Company, Saint Paul, Minn.

[21] Appl. No.: 113,728

[22] Filed: Jan. 21, 1980

Related U.S. Application Data

[63] Continuation of Ser. No. 908,152, May 22, 1978, abandoned.

[51] Int. Cl.³ .................................................. H01R 23/72
[52] U.S. Cl. .................................. 339/17 CF; 339/174
[58] Field of Search .......... 339/17 CF, 75 R, 17 MP, 339/91 R, 174; 361/409, 4 B; 174/138 G

[56] References Cited

U.S. PATENT DOCUMENTS

| | | | |
|---|---|---|---|
| 3,335,327 | 8/1967 | Damoiu et al. | 339/17 CF X |
| 3,831,131 | 8/1974 | Woodcock et al. | 339/17 CF X |
| 3,846,737 | 11/1974 | Spaulding | 339/17 CF X |
| 3,873,173 | 3/1975 | Awarlt | 339/17 CF |
| 3,942,854 | 3/1976 | Klein et al. | 339/17 CF |
| 3,999,827 | 12/1976 | Hutchison et al. | 339/17 CF |
| 4,063,791 | 12/1977 | Cutchaw | 339/75 MP X |
| 4,130,322 | 12/1978 | Spaulding | 339/176 MP X |

FOREIGN PATENT DOCUMENTS 2254620  5/1973  Fed. Rep. of Germany ... 339/17 CF

Primary Examiner—Eugene F. Desmond
Attorney, Agent, or Firm—Cruzan Alexander; Donald M. Sell; Edward T. Okubo

[57] ABSTRACT

A connector system for connection of leadless large scale integrated circuit devices to a printed circuit board or to other termination means is disclosed.

7 Claims, 4 Drawing Figures

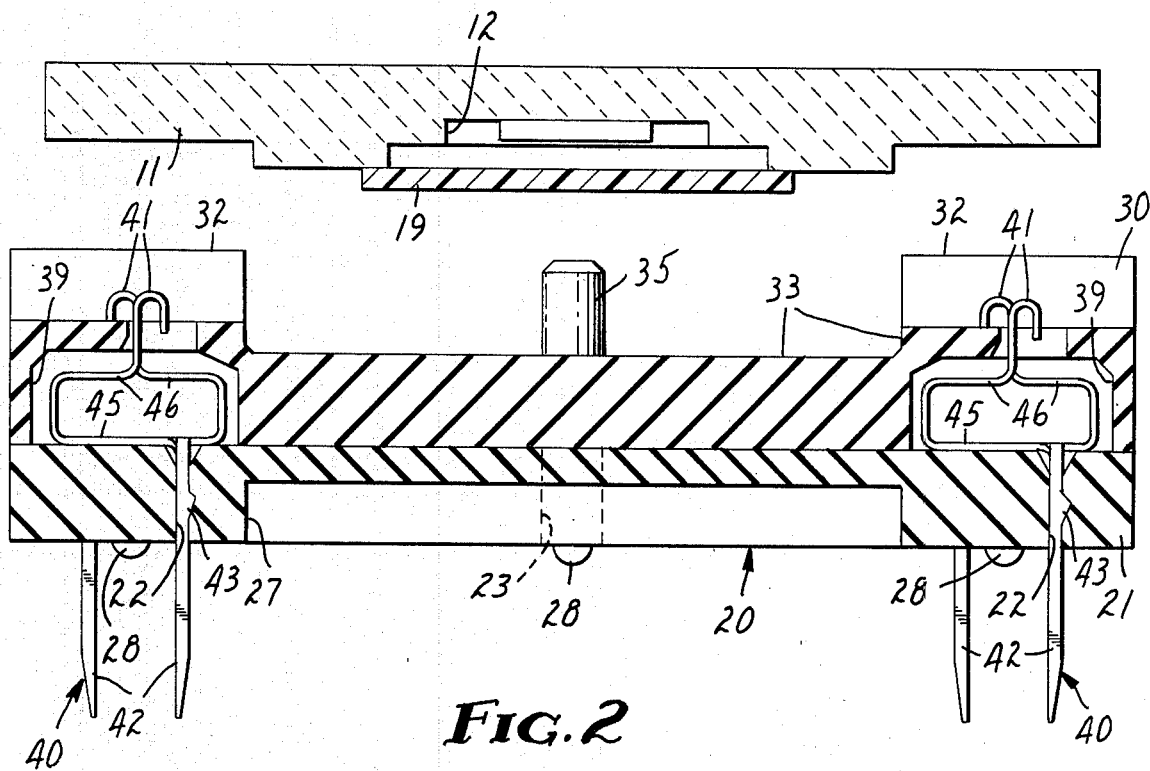
FIG. 2
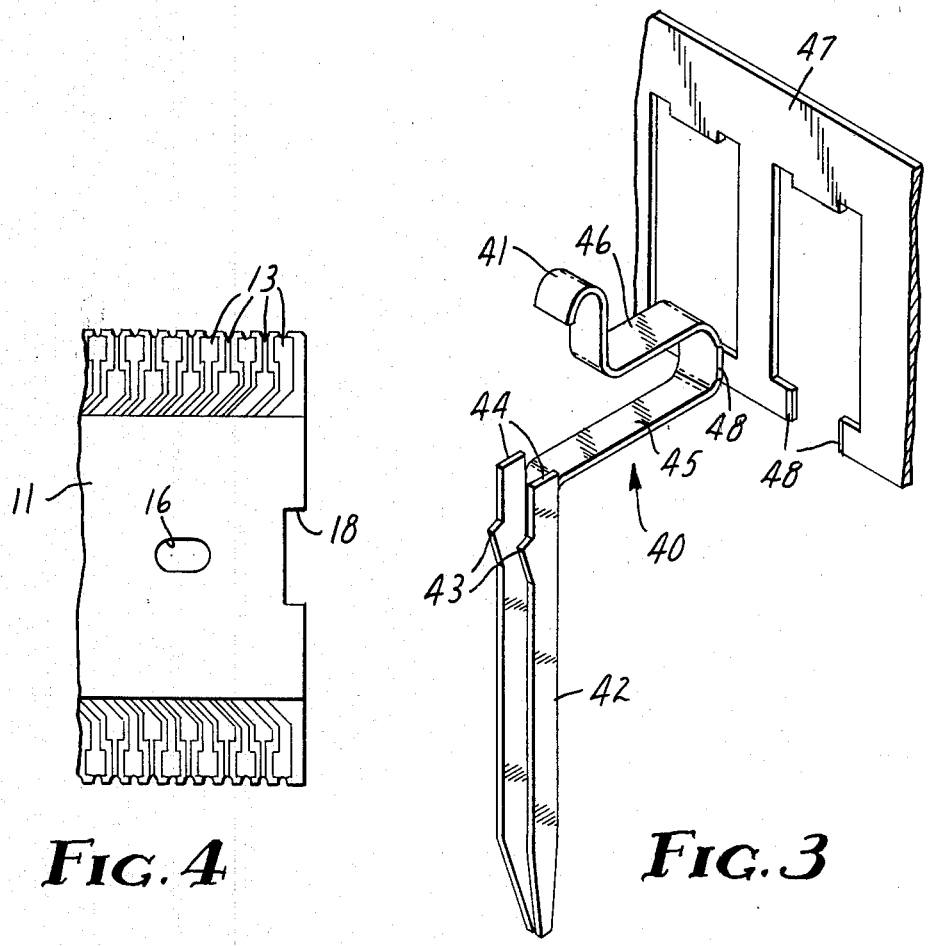
FIG. 4
FIG. 3

CONNECTOR SYSTEM

This is a continuation of application Ser. No. 908,152, filed May 22, 1978, now abandoned.

BACKGROUND OF THE INVENTION

The present invention relates to a connector system for connection of leadless large scale integrated circuit (LSI) devices to a printed circuit board or to other termination means and comprises a leadless ceramic carrier, a leaded socket and a cover member. Contact is made between the pads on the leadless LSI carrier and a printed circuit board through contact elements carried by the leaded socket.

Semiconductors and printed circuitry have greatly affected the electronic industry. The increase in circuit density in electronic devices achieved thereby has stepped up the demand for denser termination and contact patterns. Recent advances in LSI technology has made it possible to produce electronic circuitry which is so dense that a single chip may contain from 20,000 to 50,000 transistors.

For a number of years, the dual in line (DIP) package configuration has been the package of choice in the electronic industry. Designs with up to 64 leads have been used, but the most popular sizes have 40 pins or less. The increased capability of LSI technology and the accompanying increased system complexities have increased the demand for packages with greater than 40-pin counts. The DIP comprises a main body which houses the integrated circuit and has two parallel rows of leads or "legs" coming off both sides of the body.

Mounting of the DIP on a printed circuit board has traditionally been accomplished by soldering the legs directly to the board or by being plugged into a socket which has been soldered into place on the board. While soldering provides very reliable gas tight electrical connections, it also makes assembly and removal of the package difficult due to the necessity of applying heat. The heat necessary to form the solder connection is quickly conducted through the leads into the integrated circuit package which may cause overheating thereof. Overheating can cause cracks in the glass seal and can damage the integrated circuit. Heat also can warp and/or cause delamination of the printed circuit board. The application of heat is relatively easy to control during initial assembly of the circuit board under factory conditions. However, many costly elements and wiring board assemblies have been destroyed by the application of excessive heat at installation sites.

Another package, the leadless carrier, offered a number of advantages over the traditional DIP. First, there are no legs which means lower initial cost and higher manufacturing yields. Second, leadless carriers are significantly smaller than equivalent DIPs which thus permits higher packaging densities and shorter lead lengths.

Just as with DIPs, unsoldering a leadless carrier at an installation site is very undesirable. Due to the problems of replacement inherent with solder connections, many types of demountable connectors have been developed which do not require the use of heat in the formation of the electrical connections. These connectors employ what may be called pressure contacts for the formation of the electrical connections.

In general, connectors which are soldered in place require solder leads or legs for the connector and require minimum contact centers of about 0.10 inch to avoid solder bridging across adjacent pads on the circuit board. Connection pads on the carrier may be formed either along the edge, top or bottom. In all cases, however, the pluggable connection is made by pressing individual metal contacts against pads on the carrier. The need for individual metal contacts has meant that the connector must inevitably be large enough to accommodate and separate each of the individual contacts. The contacts themselves must be large enough to supply adequate spring force to insure a good electrical connection. In addition to these constraints, the precision stamping and assembly requirements have proved to be quite expensive.

Other problems encountered with the DIPs described hereinabove have included high thermal resistance, high pin-to-pin capacitance and high lead resistance due to the long lead lengths especially in the high pin count DIPs.

SUMMARY OF THE INVENTION

The present invention relates to a connector system for leadless LSI devices and comprises a leadless ceramic carrier, a leaded socket and a cover member. The leadless ceramic carrier serves as a protective package for the LSI device and for making connection from the LSI device to the carrier. The leaded socket connects the pads on the leadless carrier to the circuit board via contact elements enclosed within the leaded socket. The cover member holds the leadless carrier in place and dissipates the heat which is generated by the LSI in the carrier.

BRIEF DESCRIPTION OF THE DRAWINGS

In the accompanying drawings which illustrate the invention:

FIG. 2 is a sectional end view of the connector system of the present invention;

FIG. 3 is an enlarged perspective view of the contact element of the present invention; and FIG. 4 is an enlarged plan view of a portion of the leadless ceramic carrier of the present invention.

DETAILED DESCRIPTION OF THE INVENTION

Figure 1:
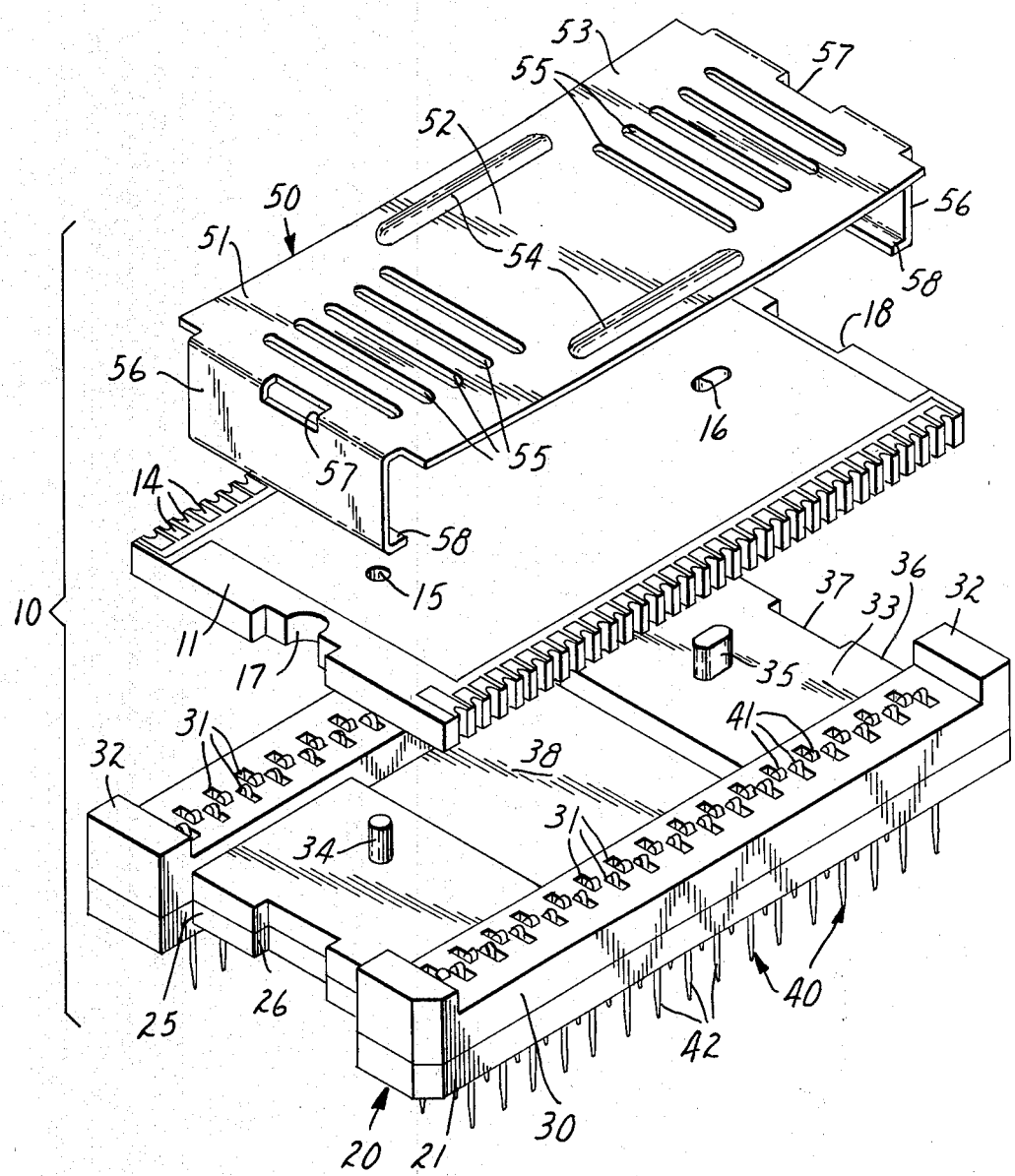
FIG. 1 is an exploded perspective view of the connector system of the present invention.

Referring more particularly to the drawings, connector system 10 comprises leadless ceramic carrier 11, leaded socket 20 and cover member 50.

In the illustrated embodiment, leadless ceramic carrier 11 is fabricated of generally conventional materials and design except for the areas of (1) size—the carrier 11 is able to reduce the circuit board area by about 40 percent when compared to conventional DIPs; (2) contact pad configuration—twice the number of contact pads 13 is provided in the same space; and (3) chip capacity—the cavity 12 in a 64-pin package is large measuring 400×400 mils with a depth of 25 mils, thus being capable of accommodating large LSI chips.

Carrier 11 is fabricated from any of the high quality ceramics of the type utilized in the manufacture of DIPs. It has high mechanical strength characteristics achieved in part by the reduction in total length. Carrier 11 for a 64-pin configuration nominally measures 1.65×1.0×0.085 inches thick, or approximately 50 percent of the size of a comparable 64-pin DIP. The increased mechanical strength results in much higher yields for the semiconductor manufacturers in that fewer assemblies are damaged due to handling and testing. An additional benefit is that there are no leads which can be bent or damaged during the handling and testing process.

In a 64-pin configuration, carrier 11 is provided with 32 contact pads 13 in two staggered rows along the edge of each side on one face thereof on 50 mil centers, the individual contact pads 13 in each row, however, being on 100 mil centers. On its other face, also along the edges, each of the 32 contact pad traces from the other face is terminated as probe contact 14. The probe contacts 14 along each edge are arranged in a single row on 50 mil centers.

Carrier 11 is also provided with a pair of locating apertures 15, 16, each aperture being differently configured for keying so that carrier 11 cannot be incorrectly inserted into the leaded socket 20. The ends of carrier 11 are provided with notches 17, 18, for a purpose to be described, also of slightly differing configurations as can be clearly seen in FIG. 1.

Leaded socket 20 is formed of a bottom element 21 and a top element 30. Bottom element 21 is generally rectangular in shape, is formed from insulating material and is provided with two rows of staggered cavities 22 along each longitudinal edge thereof on 50 mil centers, the individual cavities 22 in each row, however, being on 100 mil centers. A pair of locating apertures 23 is formed in bottom element 21, the shapes and locations of which correspond to the locating apertures 15, 16 provided in carrier 11. The ends of bottom element 21 are each centrally cut away in a rectangular pattern to form indented edges 25. The bottom of edges 25 are slightly undercut so that edges 25 are of lesser thickness than the remainder of bottom element 21. The central portion of such edges 25 is further cut away in a rectangular pattern to form notches 26 for a purpose to be described. The central portion of the bottom surface of bottom element 21 is cut away in a substantially rectangular pattern 27, leaving, however, lands connected to the surrounding bottom surface around the locating apertures 23. Located at the four corners and upon the lands adjacent the locating apertures 23 are slight protuberances 28 which serve to space connector 10 from the circuit board.

Top element 30 is also generally rectangular in shape, formed of an insulating material and is provided with two staggered rows of cavities 31 along each longitudinal edge thereof on 50 mil centers, said cavities 31 being somewhat larger than cavities 22 for a purpose to be described. End walls 32 are provided adjacent to form a recess 33 for ceramic carrier 11. A pair of locating posts 34, 35 is provided on each surface of top element 30, the shapes and locations of which correspond to the locating apertures 15, 16 in carrier 11 and 23 in bottom element 21. The ends of top element 30, including end walls 33 are each centrally cut away in a rectangular pattern corresponding in dimensions to the cut-away in bottom element 21 to form indented edges 36. The central portion of such edges 36 is further cut away in a rectangular pattern also corresponding to the cut-away in bottom element 21 to form notches 37 for a purpose to be described. Top element 30 is further provided with a central aperture 38 to accommodate the cover seal 19 on carrier 11 which seals the LSI device in cavity 12. Longitudinal grooves 39 underlying cavities 31 are provided in the bottom surface of top member 30, as viewed in FIG. 2, to accommodate contact elements 40.

Contact elements 40 are die cut from a thin flat plate of resilient metal such as spring tempered Copper Nickel Alloy 725, nominally 5 mils thick and is usually provided with a conductive coating such as a 24K gold cladding over a nickel interliner, said gold cladding being about 0.00003 inch in thickness, at the contact area 41 of said contact element 40 which makes contact with the contact 13 of carrier 11.

As can be clearly seen in FIG. 3, contact element 40 has a generally U-shaped leg portion 42 formed by bending the flat stock at approximate right angles. The end of leg portion 42 is cut off at an acute angle to provide a pointed tip. At its upper end, leg 42 is provided with a pair of locking tabs 43 for engagement with the walls of cavities 22. The upper end of leg 42 terminates in a pair of tabs 44 which help to rigidify leg 42.

The central portion 45 of contact element 40 joins leg portion 42 at a right angle at one end. The other end of central portion 45 is C-shaped and joins spring beam member 46 which is generally parallel to central portion 45. Spring beam member 46 is joined at a right angle to contact area 41 which is generally J-shaped.

In a specific illustrative embodiment, using the above-identified metal plate, the overall length of contact element 40 is 0.425 inch and the overall width is 0.03 inch. The length of leg portion 42 is 0.3 inch with the legs of the U being 0.015 inch. The central portion 45 is 0.125 inch long and the height of the C is 0.05 inch. The spring beam member is 0.08 inch long and the leg of the J-shaped contact area is 0.075 inch, the curved portion thereof having the gold cladding applied thereto being 0.03 inch $\times$ 0.035 inch.

As will be clearly seen in FIG. 3, contact elements 40 are not completely removed from the plate stock in the forming process. Instead, a portion of the plate stock 47 from which contact elements 40 have been die cut is left attached at the juncture of the central portion 45 and spring beam member 46 so that contact elements 40 are interconnected together in strip form. Plate 47 may be scored during the die cutting operation along the junction lines 48 so that contact elements 40 can be readily separated into individual elements when desired.

Cover member 50 is generally rectangular with a length substantially equal to the length of carrier 11 and is just sufficiently narrow to avoid electrical contact with the rows of probe contacts 14 on the surface of carrier 11, which, as earlier described, are in a single row along each longitudinal edge thereof and is fabricated from a copper alloy with very high thermal conductivity properties. Preferably, cover member 50 is spring tempered and is provided with a heat conducting finish coat such as a nickel plate. The top surface of cover member 50 is divided into three approximately equal portions 51, 52 and 53. The central portion 52 is substantially flat so that intimate contact can be made with the surface of carrier 11 immediately over the LSI chip contained therein. Central portion 52 is provided with a longitudinal rib 54 adjacent and along each of its outer edges to lend strength and rigidity to cover member 50.

Each of the outer end portions 51 and 53 of cover member 50 is bent at a slight outward upward angle at its juncture with central portion 52, for a purpose to be described. A plurality of transverse slots 55 is provided in each end portion 51, 53.

Depending from the outer end of each end portion 51, 53 is an end wall 56 having a length equal to the combined thickness of carrier 11 and leaded socket 20, less the depth of the undercut along the bottom of edge 25, and having a width equal to indented edges 25 and 36. A central rectangular aperture 57 is cut out at the junction of each end portion 51, 53 with depending end walls 56, corresponding in size and location to the cutaways in edges 25 and 36. An inwardly turned lip 58 is attached to the free end of each end wall 56.

The connector system 10 of the present invention is assembled by first mounting the chip into the cavity 12 of carrier 11 in the conventional manner. Wire bond connections are then made from the chip to contact points provided along the perimeter of the cavity 12, again in the conventional manner after which cover seal 19 is attached. Leadless socket 20 is assembled by first inserting an interconnected strip of contact elements 40 into cavities 22 in bottom element 21. After contact elements 40 are firmly seated in cavities 22, the connecting strip of plate stock 47 is broken off along lines 48 leaving an individual contact element 40 in each cavity 22. Top element 30 is then assembled onto bottom element 21, the locating posts 34 and 35 and complementarily shaped locating apertures 23 insuring proper orientation of top element 30 to bottom element 21. In this assembly process, central portion 45 and spring beam member 46 of contact elements 40 are received within longitudinal grooves 39 in top element 30 and J-shaped contact area 41 thereof protrudes through cavities 31, as clearly shown in FIG. 2. If desired, the two parts of leaded socket 20 may be sealed together as by sonic or heat welding or with a suitable adhesive.

The thus assembled leaded socket 20 is placed onto a printed circuit board (not shown) with leg portions 42 protruding through apertures in the circuit board which is then wave soldered in the conventional manner. It should be noted that leaded socket 20 is mechanically keyed by means of the staggered arrangement of leg portions 42 in cavities 22 and the circuit board hole pattern such that it cannot be improperly inserted into the circuit board. After the circuit board is cleaned, leadless ceramic carrier 11 is then placed into recess 33 with the cavity 12 facing downwardly, as viewed in FIGS. 1 and 2. Again, locating posts 34 and 35 and locating apertures 15 and 16 make it impossible to insert the carrier 11 into the socket 20 with any other orientation than the proper orientation. Finally, cover member 50 is placed over carrier 11 and snapped onto socket 20, end walls 56 fitting within the rectangular cut-outs in the top element 30 and bottom element 21 with inturned lip 58 engaging the cut away portion along the bottom of edge 25. Tension is maintained between inturned lip 58 and edge 25 by the upwardly bent end portions 51 and 53 of cover member 50. Carrier 11 is thus firmly pressed downwardly in recess 33 and contact pads 13 are pressed onto the protruding J-shaped contact areas 41 of contact elements 40. Electrical connection is made when the J-shaped contact area 41 of contact element 40 wipes against contact pad 13 on carrier 11. The wiping contact is enhanced and maintained through the action of spring beam member 46 which also effects electrical separation of the contact area 41 of adjacent contact elements 40 by a bending action upon contact with contact pad 13. As viewed in the left lower corner of FIG. 2, contact area 41 of the contact element 40 closest to the viewer would bend to the right and the contact element distal to the viewer would bend to the left. Cavities 31 in top element 30, it will be remembered, were sized to be somewhat large to accommodate this bending action of J-shaped contact area 41. Electrical connection is also enhanced by the gold cladding on contact area 41. When it is desired to remove carrier 11 from socket 20 for diagnostic, "debugging", maintenance or other purposes, a screwdriver blade is inserted perpendicularly into aperture 57 in cover member 50 and also into aligned notches 26 and 37; slight outward pressure against end wall 56 will disengage inturned lip 58 from edge 25. Cover member 58 can then be lifted off and carrier 11 removed.

The connector system 10 of the present invention makes it possible to provide a high pin count package to take advantage of the advances in LSI technology without increasing the physical size of the package. The connector system of the present system is, in fact, about 60 percent smaller than a comparable DIP.

The electrical performance of an electronic package is, of course, affected by its size and geometry. Package geometry dictates trace lengths and uniformity of trace widths. Lead resistance and inter-lead capacitance are directly affected but can also vary due to different path lengths. For example, the longest trace on a typical 64-lead DIP is over six times as long as the corresponding trace on one type of leadless carrier. The ratio of longest to shortest trace on a 64-lead DIP is 7:1 while the ratio is 5:1 for the leadless carrier of the present invention. These unequal trace lengths and long electrical paths of DIPs have severely limited their effective use in high performance applications. In general, shorter trace lengths result in lower resistance and inter-lead capacitance which permits faster switching times and overall improved performance. The maximum lead resistance of the leads in the present connector system is 0.3 ohm and the maximum lead-to-lead capacitance is less than 3 pfd as compared to values of 1.1 ohm resistance and 6.6 pfd capacitance in a comparable DIP.

In the past, high pin count packages, especially the DIPs, suffered from the force required to insert the package into or remove same from a socket. This resulted in bent or broken leads, broken packages and damaged sockets. As a result, only a limited number of insertions of the package into the socket was possible before permanent damage occurred. The system of the present invention has "zero insertion force" as well as "zero extraction force" so a large number of insertions or removals may be safely accomplished.

It will be recalled that the leadless chip carrier in the present invention makes contact with the contact elements on the bottom side and a set of probe contacts is provided on the opposite or top surface of the carrier. This arrangement makes it possible to make direct electrical measurements at any contact point while the chip is in operation in situ, a very valuable diagnostic and maintenance tool.

Cover member 50, in addition to securely holding the leadless chip carrier 11 into intimate electrical contact in socket 20, also serves as a heat dissipating element through the material of the cover member making intimate contact with the surface of carrier 11. Heat dissipation can also be enhanced by, for example, providing cooling fins, etc. on the central portion 52 of cover member 50. The thermal resistance of the connector system of the present invention is 35° C. per watt which is extremely low when considering the reduced circuit board area occupied by the system.

What is claimed is:

1. A connector system for connection of leadless large scale integrated circuit devices to a printed circuit board and in situ electrical measurement at any contact point while said circuit device is in operation comprising a reduced size, high pin count leadless ceramic carrier, a leaded socket having contact elements enclosed therewithin and a cover member, said leadless ceramic carrier being elongate and having closely spaced contact pads on one surface in two staggered rows along each of its longitudinal edges on 50 mil centers, the individual contact pads in each row being on 100 mil centers, which contact pads are replicated onto the other surface as probing contacts in a single row along each of its longitudinal edges on 50 mil centers, said leaded socket comprising interengaging elongate perimetrically equal top and bottom elements housing contact elements therewithin, said top element having a recess in its upper face to receive said leadless ceramic carrier, said top element having cavities therein in alignment with the staggered contact pads on said leadless ceramic carrier and being longitudinally grooved in its lower face for accomodation of the central portion of said contact elements, said bottom element having cavities therein in alignment with the corresponding cavities in said top element for insertion of said contact elements therein, said contact elements having a leg portion, a central portion connected at one end to said leg portion and at its other end to a spring beam member, and a contact area joined to said spring beam member, said contact area adapted to make wiping contact with said contact pads on said carrier, and said cover member being elongate with a length substantially equal to the length of said carrier and a width just sufficiently narrower than said carrier to thereby expose said single rows of probing contacts along each longitudinal edge of said carrier and having a substantially flat central portion adapted to intimately contact the underlying surface of said leadless ceramic carrier and end portions which are slightly outwardly upwardly angled and joined to depending end walls having an inturned lip at its free ends, said lip adapted to engage an edge of said bottom element to thereby latch said cover member to said leaded socket.

2. A connector system according to claim 1 wherein the lead resistance of the leads is less than 0.5 ohm.

3. A connector system according to claim 1 wherein the lead-to-lead capacitance is less than 5 pfd.

4. A connector system according to claim 1 wherein said contact elements comprise a leg portion bent upon itself in a generally U-shaped configuration having a guide tip formed at its free end for guiding said leg portion into apertures in said printed circuit board and retaining means at its other end, a flat generally C-shaped central portion joined to said leg portion at a right angle at one end thereof, a flat spring beam member generally parallel with and joined to said central portion at one end, said spring beam member being substantially shorter than said central portion whereby the junction of said leg portion and said central portion is exposed, and a flat generally J-shaped contact area joined to said spring beam member at a right angle, the curved portion of said J-shaped contact area of said contact elements protruding above the surface of said top element in coplanar relationship such that wiping electrical connection to the contact pads is uniformly established when said leadless ceramic carrier is pressed upon said coplanar contact areas.

5. A connector system according to claim 4 wherein said coplanar contact areas of said contact elements are capable of moving away from each other when pressure is applied from the top of said coplanar contact areas thereby to effect electrical separation between adjacent contact areas while still maintaining their coplanar relationship.

6. A connector system according to claim 1 wherein said cover member is formed of a material having high thermal conductivity properties to thereby dissipate heat generated by the large scale integrated circuit device.

7. A connector system according to claim 1 having zero insertion force and zero extraction force for said leadless ceramic carrier.

* * * * *